(12) United States Patent
Ikegaya et al.

(10) Patent No.: US 10,170,415 B2
(45) Date of Patent: Jan. 1, 2019

(54) SEMICONDUCTOR DEVICE, SEMICONDUCTOR INTEGRATED CIRCUIT, AND LOAD DRIVING DEVICE

(71) Applicant: HITACHI AUTOMOTIVE SYSTEMS, LTD., Ibaraki (JP)

(72) Inventors: Katsumi Ikegaya, Hitachinaka (JP); Takayuki Oshima, Hitachinaka (JP)

(73) Assignee: Hitachi Automotive Systems, Inc., Ibaraki (JP)

( * ) Notice: Subject to any disclaimer, the term of this patent is extended or adjusted under 35 U.S.C. 154(b) by 0 days.

(21) Appl. No.: 15/752,818

(22) PCT Filed: Jul. 25, 2016

(86) PCT No.: PCT/JP2016/071658
§ 371 (c)(1),
(2) Date: Feb. 14, 2018

(87) PCT Pub. No.: WO2017/033642
PCT Pub. Date: Mar. 2, 2017

(65) Prior Publication Data
US 2018/0247892 A1    Aug. 30, 2018

(30) Foreign Application Priority Data
Aug. 21, 2015  (JP) .................... 2015-163319

(51) Int. Cl.
*H01L 23/522* (2006.01)
*H01L 21/28* (2006.01)
(Continued)

(52) U.S. Cl.
CPC .......... *H01L 23/5228* (2013.01); *H01L 21/28* (2013.01); *H01L 21/3205* (2013.01);
(Continued)

(58) Field of Classification Search
CPC ... H01L 21/28; H01L 21/3205; H01L 21/768; H01L 27/088; H01L 29/78; H01L 23/5228; H01L 23/522; H01L 23/5226
(Continued)

(56) References Cited

U.S. PATENT DOCUMENTS

| 2002/0024141 A1* | 2/2002 | Amishiro | H01L 23/5222 |
|---|---|---|---|
| | | | 257/758 |
| 2005/0017299 A1* | 1/2005 | Shen | H01L 23/522 |
| | | | 257/341 |
| 2010/0213549 A1* | 8/2010 | Yamamoto | H01L 27/0266 |
| | | | 257/355 |

FOREIGN PATENT DOCUMENTS

| JP | 07-045829 A | 2/1995 |
|---|---|---|
| JP | 2000-216264 A | 8/2000 |

(Continued)

OTHER PUBLICATIONS

International Search Report dated Oct. 18, 2016 of International Application No. PCT/JP2016/071658.

*Primary Examiner* — Thomas Skibinski
(74) *Attorney, Agent, or Firm* — Volpe and Koenig, P.C.

(57) ABSTRACT

On a transistor layer having arranged thereon multiple transistors each including a drain, a source, and a gate, metal interconnection layers serving as input side interconnection layers connected to the drains of the respective transistors and metal interconnection layers serving as output side interconnection layers connected to the sources of the respective transistors are arranged in parallel. Also provided are a plurality of through holes connecting the metal interconnection layers serving as input side interconnection layers to the drains of the respective transistors and connecting the metal interconnection layers serving as output side interconnection layers to the sources of the respective transistors. Resistance values of the plurality of through (Continued)

holes are changed along an arranging direction of the input side interconnection layers and the output side interconnection layers. Accordingly, current densities of the transistors arranged to be distributed in a two-dimensional manner can be uniform.

10 Claims, 9 Drawing Sheets

(51) Int. Cl.
*H01L 21/3205* (2006.01)
*H01L 21/768* (2006.01)
*H01L 29/78* (2006.01)
*H01L 27/088* (2006.01)
*H01F 7/06* (2006.01)

(52) U.S. Cl.
CPC .......... *H01L 21/768* (2013.01); *H01L 23/522* (2013.01); *H01L 23/5226* (2013.01); *H01L 27/088* (2013.01); *H01L 29/78* (2013.01); *H01F 7/064* (2013.01)

(58) Field of Classification Search
USPC ........ 327/108–112, 427, 434, 437, 564–566; 326/82, 83, 87; 257/355, 368, 390, 341, 257/E23.142, 758, E23.144, E23.152
See application file for complete search history.

(56) References Cited

FOREIGN PATENT DOCUMENTS

| | | |
|---|---|---|
| JP | 2006-515956 A | 6/2006 |
| JP | 2006-278677 A | 10/2006 |
| JP | 2009-246076 A | 10/2009 |
| JP | 2010-219504 A | 9/2010 |

* cited by examiner

SEMICONDUCTOR DEVICE, SEMICONDUCTOR INTEGRATED CIRCUIT, AND LOAD DRIVING DEVICE

TECHNICAL FIELD

The present invention relates to a semiconductor device, a semiconductor integrated circuit, and a load driving device.

BACKGROUND ART

In electronic control for a vehicle, a load driving device driving a load is widely used. This load driving device performs ON/OFF control of a switching element, and high current flows in a transistor used as the switching element. Multiple transistors serve as integrated circuits and are densely arranged. Drains of the respective transistors are connected to a drain pad in common while sources of the respective transistors are connected to a source pad in common.

To reduce cost of the load driving device, the size of the transistors is required to be reduced. However, when the size of the transistors is reduced, a current density of a metal interconnection layer connecting the respective transistors is high, and the location in the metal interconnection layer having a high current density may be degraded by electromigration. For this reason, the current densities on the transistors are required to be uniform. A technique described in PTL 1 aims to make such current densities uniform. A semiconductor device described in PTL 1 includes a drain through hole connecting a drain terminal of each transistor to a first conductive layer. The semiconductor device also includes a source through hole connecting a source terminal of each transistor to a second conductive layer. The arrangement distribution of the source through holes and the drain through holes differs depending on the distance from a source pad and a drain pad.

CITATION LIST

Patent Literature

PTL 1: JP 2006-278677 A

SUMMARY OF INVENTION

Technical Problem

In the aforementioned method described in PTL 1, a current density is high in a region around a boundary at which the first conductive layer and the second conductive layer are opposed. The method is disadvantageous in that the current densities cannot be uniform in the entire region of the transistors arranged to be distributed in a two-dimensional manner.

Solution to Problem

A semiconductor device according to the present invention includes a transistor layer having arranged thereon in a two-dimensional manner a plurality of transistors each including an input unit, an output unit, and a control unit, a plurality of interconnection layers configured to electrically connect the input units of the plurality of transistors to an input terminal and electrically connect the output units of the plurality of transistors to an output terminal, and a plurality of interlayer connection conductors respectively connecting the plurality of interconnection layers to the transistor layer. The plurality of interconnection layers include a first interconnection layer having arranged therein along a predetermined arranging direction at least one input side interconnection layer connected to the input terminal and at least one output side interconnection layer connected to the output terminal, and resistance values of the plurality of interlayer connection conductors differ from each other depending on a position in the arranging direction.

In a semiconductor integrated circuit according to the present invention, at least one semiconductor device is implemented on a same semiconductor chip.

A load driving device according to the present invention uses a semiconductor device as a switching element and applies voltage to a control unit of the switching element to drive a load connected to the switching element.

Advantageous Effects of Invention

According to the present invention, current densities of transistors arranged to be distributed in a two-dimensional manner can be uniform.

DESCRIPTION OF EMBODIMENTS

First Embodiment

A first embodiment of the present invention will be described with reference to FIGS. 1 to 4.

Figure 1:
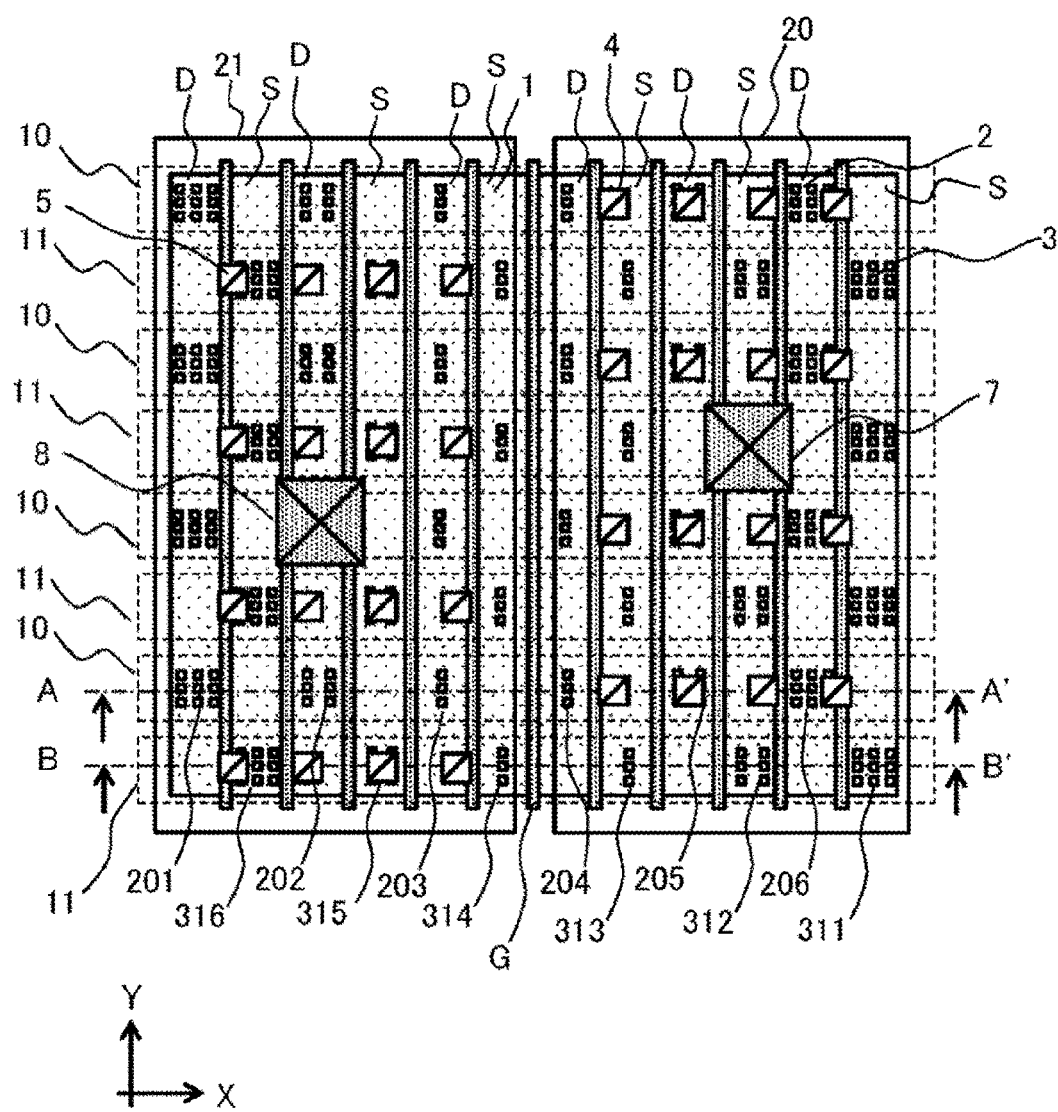
FIG. 1 is a plan view of a semiconductor device

FIG. 1 is a plan view of a semiconductor device according to the first embodiment. In the semiconductor device in FIG. 1, a plurality of interconnection layers are laminated on a transistor layer 1. The transistor layer 1 is formed by arranging multiple MOS transistors in a two-dimensional manner. Each transistor in the transistor layer 1 includes a plurality of gate electrodes G serving as control units, a plurality of drain electrodes D serving as input units, and a plurality of source electrodes S serving as output units. On the transistor layer 1, a plurality of metal interconnection layers 10 and a plurality of metal interconnection layers 11, collectively serving as a first interconnection layer, are arranged alternately in parallel. The plurality of metal interconnection layers 10 are connected to the drain electrodes D of the plurality of transistors of the transistor layer 1 via a through hole group 2 serving as an interlayer connection conductor constituted by a plurality of through holes. Similarly, the plurality of metal interconnection layers 11 are connected to the source electrodes S of the plurality of transistors of the transistor layer 1 via a through hole group 3 serving as an interlayer connection conductor constituted by a plurality of through holes. It is to be noted that, in FIG. 1, each through hole constituting the through hole group 2 or 3 is shown as a square.

On the metal interconnection layers 10 and the metal interconnection layers 11, a metal interconnection layer 20 and a metal interconnection layer 21, collectively serving as a second interconnection layer, are provided. The metal interconnection layer 20 is connected to the metal interconnection layers 10 in the first layer via a plurality of through holes 4 serving as interlayer connection conductors. Similarly, the metal interconnection layer 21 is connected to the metal interconnection layers 11 in the first layer via a plurality of through holes 5 serving as interlayer connection conductors. It is to be noted that, in FIG. 1, each of the through holes 4 and 5 is shown by a masu mark. Also, the metal interconnection layer 20 is provided with an input terminal pad 7 into which drain current flows and is connected to an input terminal of the semiconductor device via this input terminal pad 7. The metal interconnection layer 21 is provided with an output terminal pad 8 from which source current is taken out and is connected to an output terminal of the semiconductor device via this output terminal pad 8. In this manner, the interconnection layer in the second layer is split into the metal interconnection layer 20 for the drain current and the metal interconnection layer 21 for the source current.

In FIG. 1, the metal interconnection layers 20 and 21 extend in a Y direction illustrated in FIG. 1 while the metal interconnection layers 10 and 11 extend in an X direction. These metal interconnection layers are arranged to cover the entirety of the transistor layer 1 on which the transistors are arranged to be distributed in a two-dimensional manner. It is to be noted that an arranging direction of the metal interconnection layer 20 and the metal interconnection layer 21 is the X direction, and that the metal interconnection layer 20 and the metal interconnection layer 21 are arranged along this arranging direction.

Figure 2:
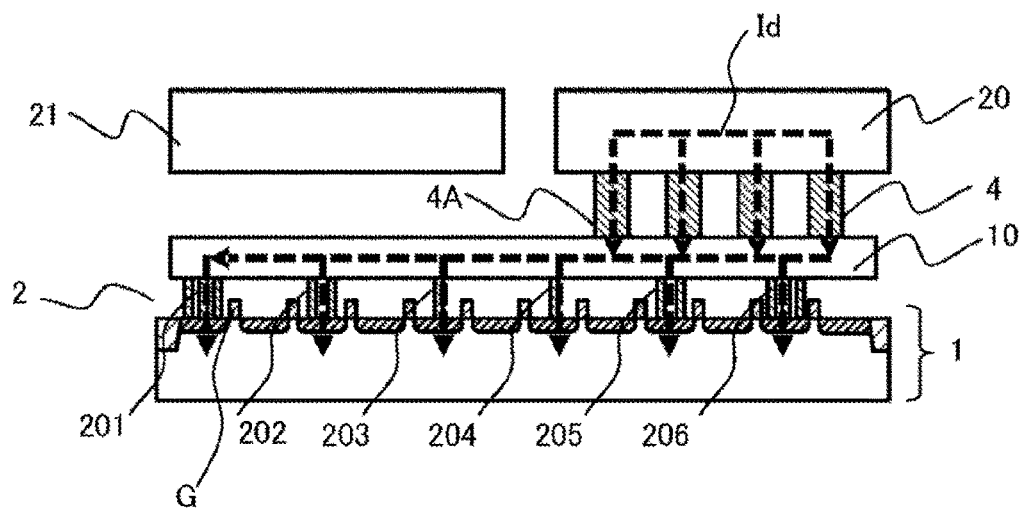
FIG. 2 is a cross-sectional view along the line A-A' in the semiconductor device in FIG. 1.
Figure 3:
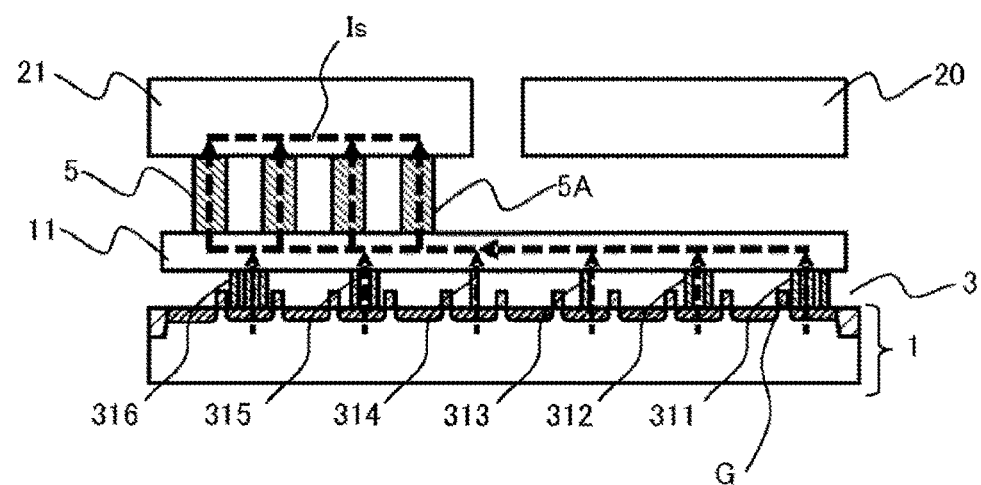
FIG. 3 is a cross-sectional view along the line B-B' in the semiconductor device in FIG. 1.

FIG. 2 is a cross-sectional view along the line A-A' in the semiconductor device in FIG. 1 along one of the plurality of metal interconnection layers 10 connected to the drain electrodes D. It is to be noted that, in FIGS. 1 and 2, some of the aforementioned through hole groups 2 shown in FIGS. 1 and 2 in common are shown as through hole groups 201 to 206. FIG. 3 is a cross-sectional view along the line B-B' in the semiconductor device in FIG. 1 along one of the plurality of metal interconnection layers 11 connected to the source electrodes S. It is to be noted that, in FIGS. 1 and 3, some of the aforementioned through hole groups 3 shown in FIGS. 1 and 3 in common are shown as through hole groups 311 to 316.

In FIG. 2, a current path Id for current flowing from the input terminal pad 7 (refer to FIG. 1) to the transistor layer 1 is provided through the metal interconnection layer 20, the plurality of through holes 4, and the metal interconnection layer 10 in the first layer. Below the metal interconnection layer 10, the current path Id is also provided through the plurality of through hole groups 201 to 206 down to the respective drain electrodes of the transistor layer 1. The plurality of through hole groups 201 to 206 are arranged at regular intervals in the metal interconnection layer 10.

As illustrated in FIG. 2, among the plurality of transistors arranged in the transistor layer 1, the transistors located on the lower side of the through holes 4 have shorter current paths provided through the metal interconnection layer 10. Conversely, the transistors located away from the through holes 4 have longer current paths provided through the metal interconnection layer 10. Voltage drop caused by interconnection resistance when current flows in the metal interconnection layer 10 is greater as the path through the metal interconnection layer 10 is longer. Thus, as for potential on the upper surfaces of the through hole groups 201 to 203, potential is the lowest on the through hole group 201, the second lowest on the through hole group 202, and the third lowest on the through hole group 203. Since the through hole groups 204, 205, and 206 are located directly below the through holes 4 connecting the metal interconnection layer 20 to the metal interconnection layer 10, potential on the upper surfaces of the through hole groups 204, 205, and 206 is equivalent to each other.

In FIG. 3, a current path Is for current flowing from the transistor layer 1 to the output terminal pad 8 (refer to FIG. 1) is provided from the respective source electrodes of the transistor layer 1 through the plurality of through hole groups 311 to 316 up to the metal interconnection layer 11. Above the metal interconnection layer 11, the current path Is is also provided through the plurality of through holes 5 and the metal interconnection layer 21 up to the output terminal pad 8 (refer to FIG. 1). The plurality of through hole groups 3311 to 316 are arranged at regular intervals in the metal interconnection layer 11.

As illustrated in FIG. 3, among the plurality of transistors arranged in the transistor layer 1, the transistors located on the lower side of the through holes 5 have shorter current paths provided through the metal interconnection layer 11. Conversely, the transistors located away from the through holes 5 have longer current paths provided through the metal interconnection layer 11. Voltage drop caused by interconnection resistance when current flows in the metal interconnection layer 11 is greater as the path through the metal interconnection layer 11 is longer. Thus, as for potential on the upper surfaces of the through hole groups 311 to 313 in FIG. 3, potential is the highest on the through hole group 311, the second highest on the through hole group 312, and the third highest on the through hole group 313. Since the through hole groups 314, 315, and 316 are located directly below the through holes 5 connecting the metal interconnection layer 21 to the metal interconnection layer 11, potential on the upper surfaces of the through hole groups 314, 315, and 316 is equivalent to each other.

Next, a comparison of potential is made between the upper surfaces of the through hole groups 201 to 206 connected to the drain electrodes D and the upper surfaces of the through hole groups 311 to 316 connected to the source electrodes S on the opposite sides of the drain electrodes D with the gate electrodes interposed therebetween to derive a potential difference. Specifically, a potential difference between the through hole group 201 illustrated in FIGS. 1 and 2 and the through hole group 316 illustrated in FIGS. 1 and 3 is derived. Similarly, a potential difference between the through hole group 202 illustrated in FIGS. 1 and 2 and the through hole group 315 illustrated in FIGS. 1 and 3 is derived. A potential difference between the through hole group 203 illustrated in FIGS. 1 and 2 and the through hole group 314 illustrated in FIGS. 1 and 3 is derived. A potential difference between the through hole group 204 illustrated in FIGS. 1 and 2 and the through hole group 313 illustrated in FIGS. 1 and 3 is derived. A potential difference between the through hole group 205 illustrated in FIGS. 1 and 2 and the through hole group 312 illustrated in FIGS. 1 and 3 is derived. A potential difference between the through hole group 206 illustrated in FIGS. 1 and 2 and the through hole group 311 illustrated in FIGS. 1 and 3 is derived.

As a result of the comparisons, the potential difference between the through hole group 201 located most away from a left-end through hole 4A illustrated in FIG. 2 and the corresponding through hole group 316 is the lowest. Similarly, the potential difference between the through hole group 311 located most away from a right-end through hole 5A illustrated in FIG. 3 and the corresponding through hole group 206 is the lowest. On the other hand, the potential difference between the through hole group 203 located closest to the through hole 4A illustrated in FIG. 2 and the corresponding through hole group 314 is the highest. Similarly, the potential difference between the through hole group 313 located closest to the through hole 5A illustrated in FIG. 3 and the corresponding through hole group 204 is the highest. The other potential differences between the upper surfaces of the through hole groups are intermediate values between the lowest value and the highest value.

In this manner, the potential differences between the upper surfaces of the through hole groups 201 to 206 and the upper surfaces of the through hole groups 311 to 316 differ depending on the locations of these through hole groups on the transistor layer 1. Accordingly, to make the values of current flowing in the respective transistors of the transistor layer 1 uniform, the potential differences between the respective drain electrodes D and the respective source electrodes S located on the opposite sides of the drain electrodes D with the gate electrodes G interposed therebetween are required to be uniform at the locations on the transistor layer 1.

In the present embodiment, to make the potential differences uniform at the locations on the transistor layer 1, the distribution densities of the through holes in the through hole groups 201 and 206 on the right and left sides in FIG. 2 and the through hole groups 316 and 311 on the right and left sides in FIG. 3 are heightened so that the resistance values of the through hole groups 201, 206, 316, and 311 may be lower than those of the other through hole groups. The distribution densities of the through holes in the other through hole groups 202 to 205 and 312 to 315 are lowered so that the resistance values of the through hole groups 202 to 205 and 312 to 315 may be higher. Consequently, the potential differences between the drain electrodes D and the source electrodes S adjacent to the through hole groups 202 to 205 and 312 to 315 are equivalent to the potential difference between the bottom surface of the through hole group 201 and the through hole group 316 and the potential difference between the bottom surface of the through hole group 206 and the through hole group 311. That is, in the present embodiment, to make the potential differences between the drain electrodes D and the source electrodes S with the gate electrodes G interposed therebetween equivalent among the respective transistors, the resistance values of the through hole groups 201 to 206 and 311 to 316 are changed depending on the distances from the through holes 4A and 5A connecting the metal interconnection layers 10 and 11 to the metal interconnection layers 20 and 21. In other words, the distribution densities of the through holes in the through hole groups 201 to 206 and 311 to 316 are changed so that the through hole groups 201 to 206 and 311 to 316 closer to the boundary between the metal interconnection layer 20 and the metal interconnection layer 21 may have higher resistance values. It is to be noted that the same is true for the through hole groups 2 and 3 other than the through hole groups 201 to 206 and 311 to 316 illustrated in FIGS. 2 and 3.

Figure 4:
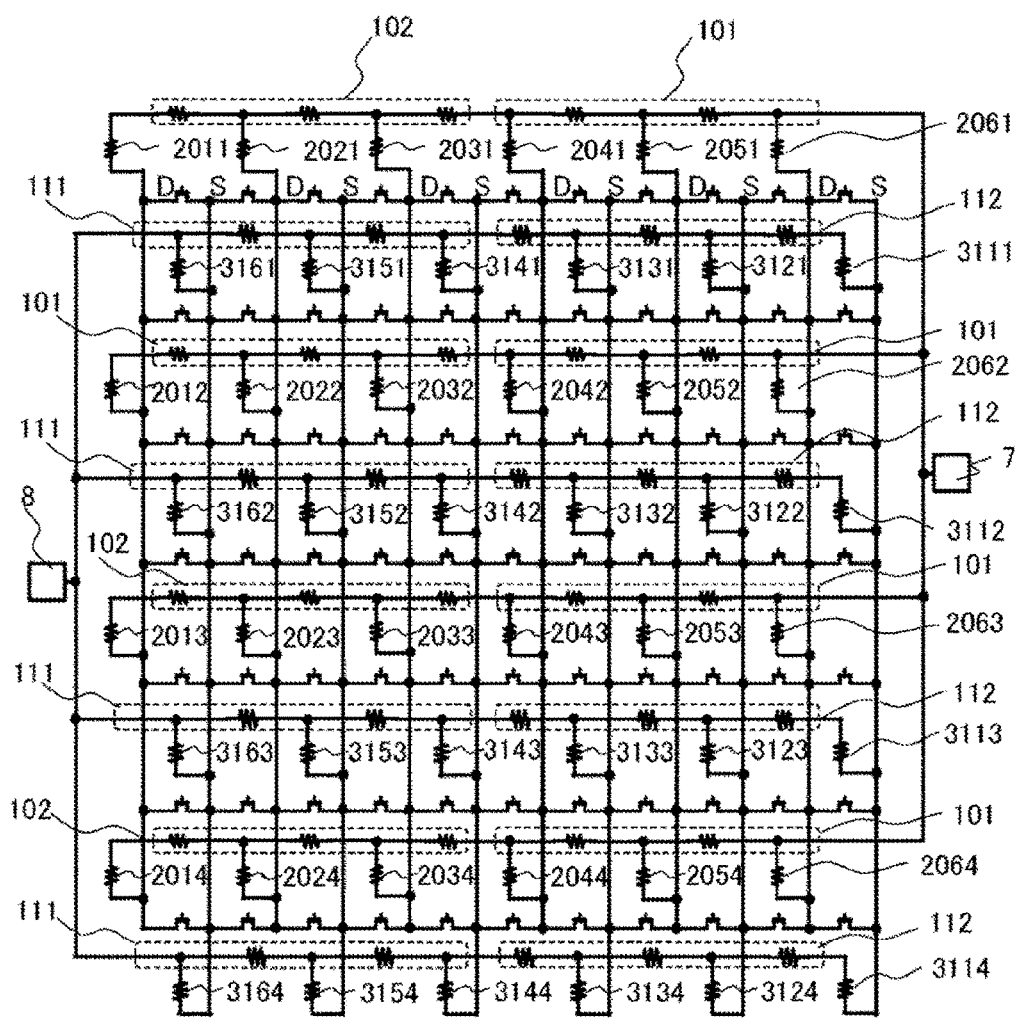
FIG. 4 is an equivalent circuit of metal interconnection layers and through holes.

FIG. 4 is an equivalent circuit illustrating resistance of the through hole groups 2 and 3 and interconnection resistance of the metal interconnection layers 10 and 11 in the semiconductor device. It is to be noted that, in FIG. 4, resistance corresponding to the through holes 4 and 5 connecting the metal interconnection layers 10 and 11 to the metal interconnection layers 20 and 21 in FIG. 1 is omitted. Connection of the gate electrodes G is also omitted.

In FIG. 4, resistance parts 2011 to 2051 are resistance parts of the through hole groups 201 to 206, and resistance parts 3161 to 3111 are resistance parts of the through hole groups 316 to 311. Also, an interconnection resistance part 101 is an interconnection resistance part of a part of the metal interconnection layer 10 connected to the metal interconnection layer 20 via the through holes 4 and corresponds to the right half of FIG. 2. An interconnection resistance part 102 is an interconnection resistance part of the left half of the metal interconnection layer 10 and corresponds to the left half of FIG. 2. An interconnection resistance part 111 is an interconnection resistance part of a part of the metal interconnection layer 11 connected to the metal interconnection layer 21 via the through holes 5 and corresponds to the left half of FIG. 3. An interconnection resistance part 112 is an interconnection resistance part of the right half of the metal interconnection layer 11 and corresponds to the right half of FIG. 3.

Interconnection resistance of the metal interconnection layers 20 and 21 is lower than interconnection resistance of the metal interconnection layers 10 and 11. In this case, since the interconnection resistance part 101 at the right half of the metal interconnection layer 10 and the interconnection resistance part 111 at the left half of the metal interconnection layer 11 are connected via the through holes 4 and 5 to the metal interconnection layers 20 and 21, voltage drop caused by these interconnection resistance parts is small. On the other hand, voltage drop caused by the interconnection resistance part 102 at the left half of the metal interconnection layer 10 and the interconnection resistance part 112 at the right half of the metal interconnection layer 11 causes in-plane distribution of voltage between the drain and source electrodes of the respective transistors arranged on the large-area transistor layer 1 to be generated. Thus, in a case in which the voltage drop caused by these interconnection resistance parts is not uniform, this causes in-plane distribution of current densities in the transistor layer 1 to be non-uniform.

In the present embodiment, the distribution densities of the through holes constituting the through hole groups 2 and 3 are changed depending on the distance from the through hole 4 or 5, that is, the location in the X direction in FIG. 1, which is an arranging direction of the metal interconnection layer 20 or 21. Accordingly, the resistance values of resistance parts 2011 to 2064 corresponding to the through hole groups 2 on the drain side and resistance parts 3111 to 3164 corresponding to the through hole groups 3 on the source side are adjusted so that the voltage drop caused by the interconnection resistance parts 102 on the left half sides of the metal interconnection layers 10 and the interconnection resistance parts 112 on the right half sides of the metal interconnection layers 11 may be offset and so that the in-plane current densities of the transistor layer 1 may be uniform.

Figure 5:
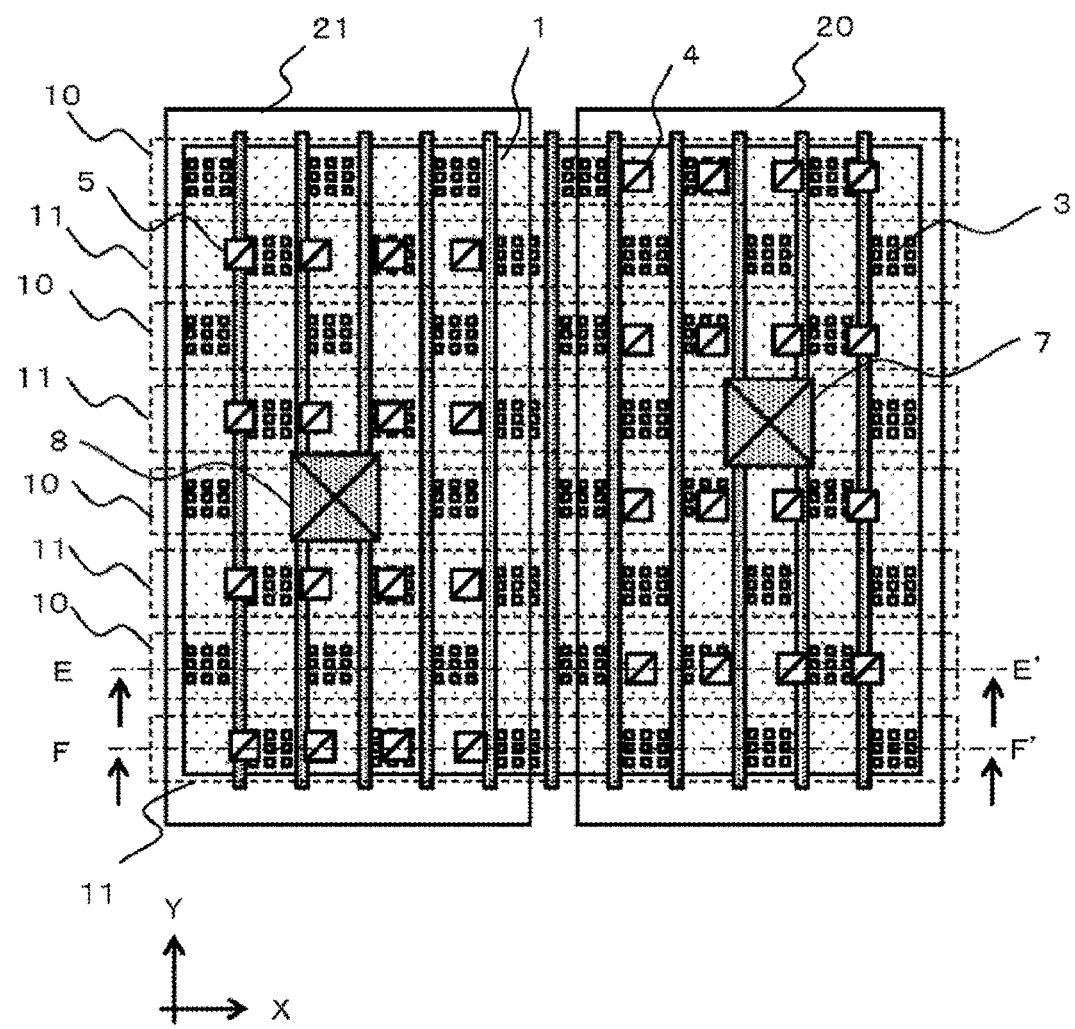
FIG. 5 is a plan view of a semiconductor device for comparison with an embodiment.
Figure 6:
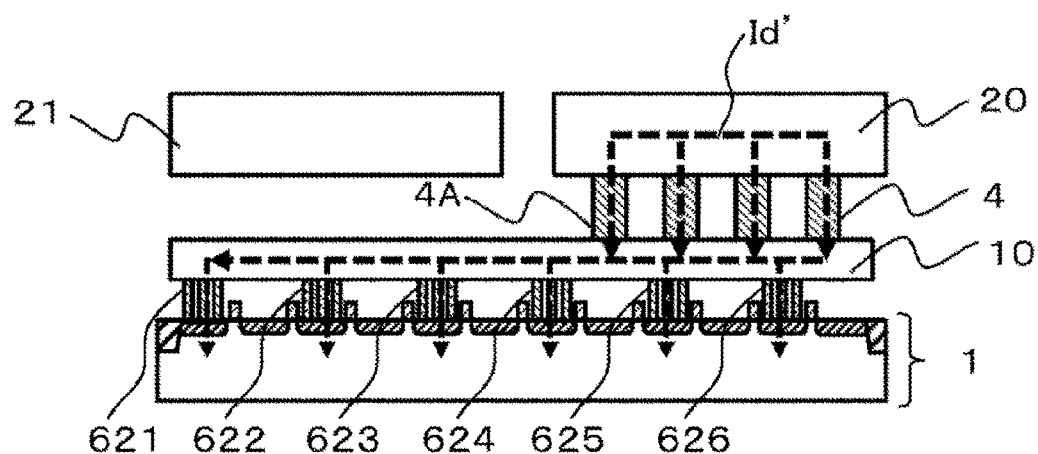
FIG. 6 is a cross-sectional view along the line E-E' in the semiconductor device in FIG. 5.
Figure 7:
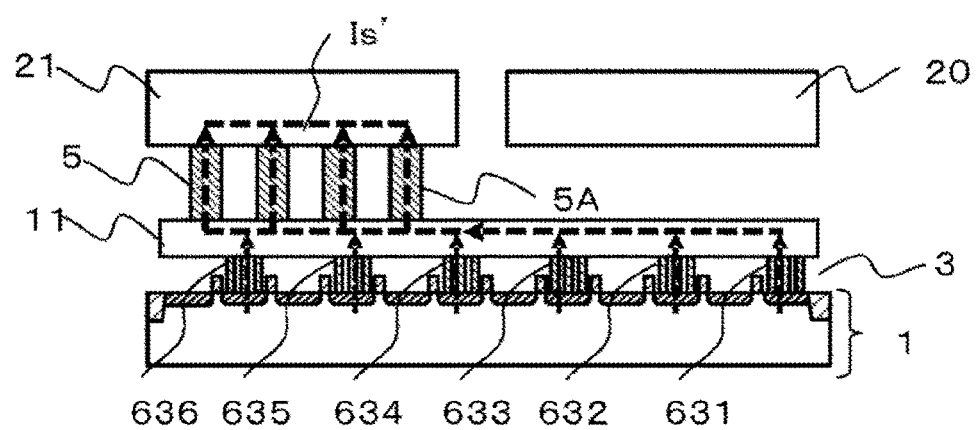
FIG. 7 is a cross-sectional view along the line F-F' in the semiconductor device in FIG. 5.

Next, referring to FIGS. 5, 6, and 7, a case in which the through hole groups 2 and 3 are uniformly distributed on the transistor layer 1 without changing the resistance values thereof will be described for comparison with the present embodiment. FIG. 5 is a plan view of a semiconductor device in a case in which the through hole groups 2 and 3 are uniformly distributed on the transistor layer 1 without changing the resistance values thereof. Similar components to those in FIG. 1 are shown with the same reference signs, and description of the duplicate components is omitted. FIG. 6 is a cross-sectional view along the line E-E' in FIG. 5 along one of the plurality of metal interconnection layers 10. It is to be noted that, in FIGS. 5 and 6, some of the through hole groups 2 shown in FIGS. 5 and 6 in common are shown as through hole groups 621 to 626. FIG. 7 is a cross-sectional view along the line F-F' in FIG. 5 along one of the plurality of metal interconnection layers 11. It is to be noted that, in FIGS. 5 and 7, some of the through hole groups 3 shown in FIGS. 5 and 7 in common are shown as through hole groups 631 to 636.

In FIG. 6, a current path Id' for current flowing from the input terminal pad 7 (refer to FIG. 5) to the transistor layer 1 is provided through the metal interconnection layer 20, the plurality of through holes 4, and the metal interconnection layer 10. Below the metal interconnection layer 10, the current path Id' is also provided through the plurality of through hole groups 621 to 626 down to the respective drain electrodes of the transistor layer 1. As the interconnection length in the metal interconnection layer 10 between the through hole 4A and each of the through hole groups is longer, voltage drop caused by interconnection resistance is greater, and current flowing in the current path Id' is lower.

In FIG. 7, a current path Is' for current flowing from the transistor layer 1 to the output terminal pad 8 (refer to FIG. 5) is provided from the respective source electrodes of the transistor layer 1 through the plurality of through hole groups 631 to 636 up to the metal interconnection layer 11. Above the metal interconnection layer 11, the current path Is' is also provided through the plurality of through holes 5 and the metal interconnection layer 21 up to the output terminal pad 8 (refer to FIG. 5). As for current flowing in this current path Is', similarly to current flowing in the current path Id', as the interconnection length in the metal interconnection layer 11 between the through hole 5A and each of the through hole groups is longer, voltage drop caused by interconnection resistance is greater, and the current flowing in the current path Is' is lower.

As illustrated in FIGS. 5, 6, and 7, since the resistance values of the through hole groups 621 to 626 and the through hole groups 631 to 636 are not changed, the current values flowing in the respective drain and source electrodes of the transistor layer 1 are not uniform in this case.

Second Embodiment

Next, a second embodiment will be described with reference to FIGS. 8, 9, and 10.

Figure 8:
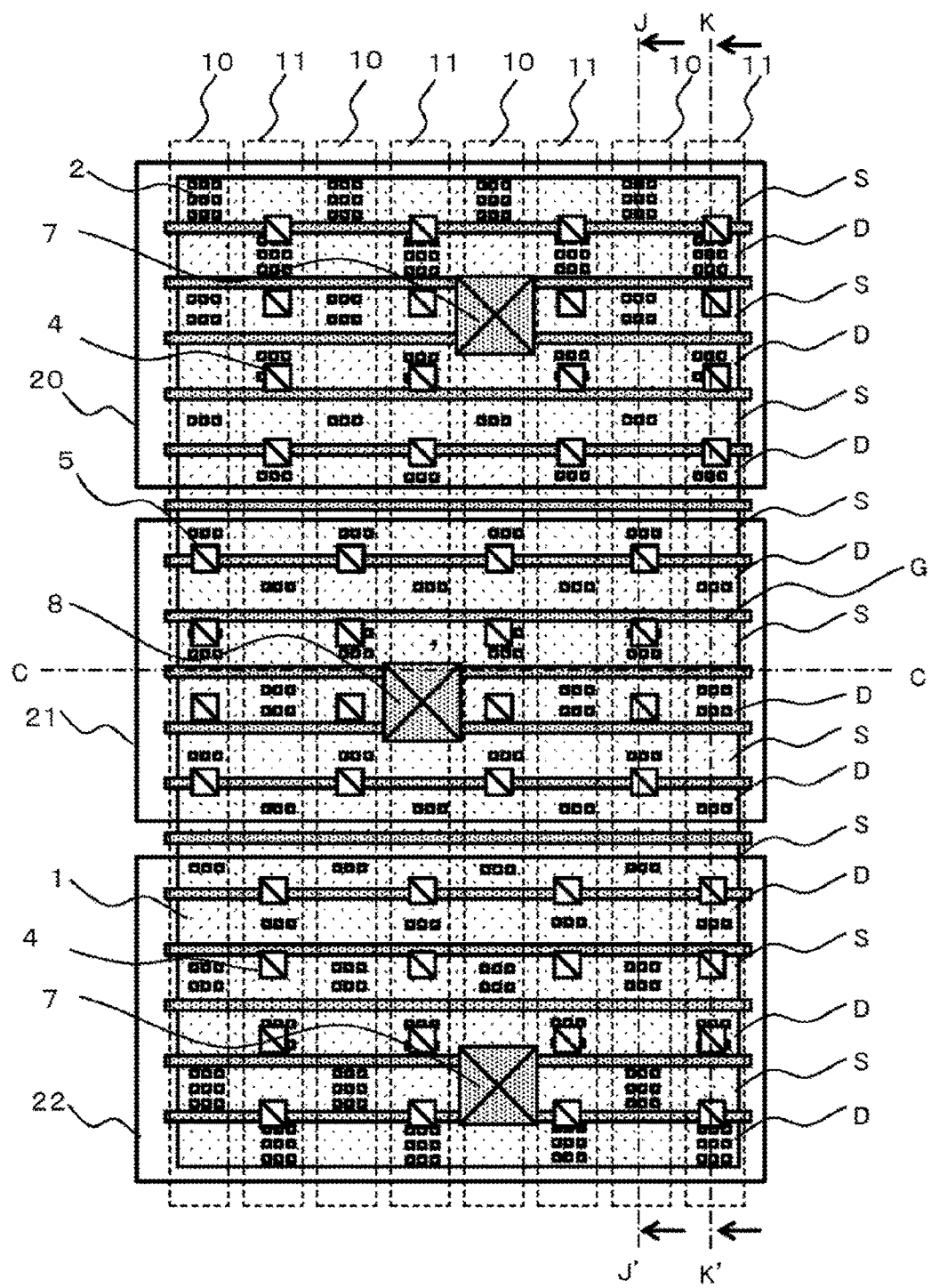
FIG. 8 is a plan view of a semiconductor device according to a second embodiment.

FIG. 8 is a plan view of a semiconductor device according to the second embodiment. In a configuration of this example, an interconnection layer in a second layer is split into three metal interconnection layers 20, 21, and 22, and the three metal interconnection layers 20, 21, and 22 are arranged in parallel. Each of the metal interconnection layers 20 and 22 is provided with the input terminal pad 7. Also, the metal interconnection layer 21 is provided with the output terminal pad 8. The metal interconnection layer 21 on the source side is interposed between the metal interconnection layers 20 and 22 on the drain side. The metal interconnection layers 10 and 11 in a first layer are arranged to intersect with the metal interconnection layers 20, 21, and 22 in the second layer.

Figure 9:
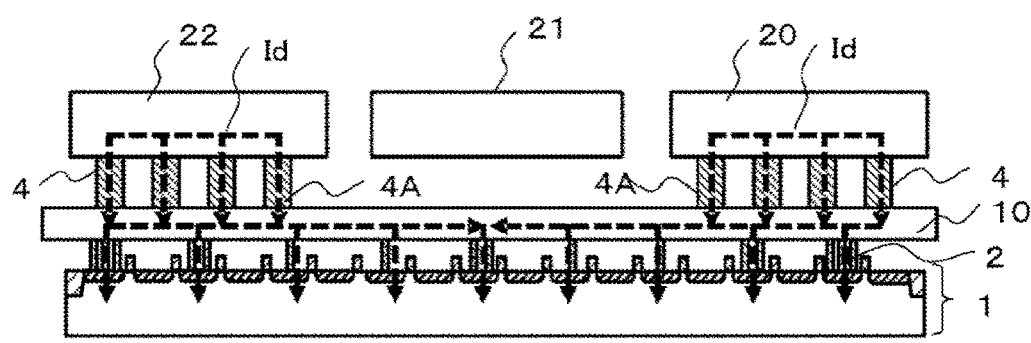
FIG. 9 is a cross-sectional view along the line J-J' in the semiconductor device in FIG. 8.
Figure 10:
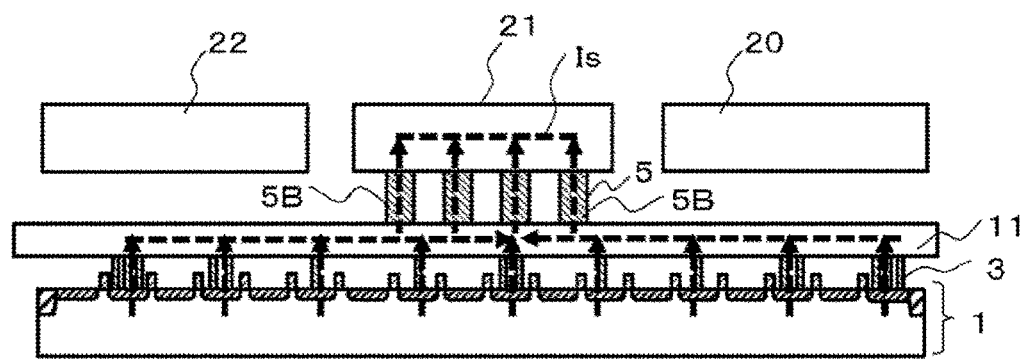
FIG. 10 is a cross-sectional view along the line K-K' in the semiconductor device in FIG. 8.

FIG. 9 is a cross-sectional view along the line J-J' in the semiconductor device in FIG. 8, and FIG. 10 is a cross-sectional view along the line K-K' in the semiconductor device in FIG. 8. As illustrated in FIG. 9, the metal interconnection layer 10 is connected to the plurality of drain electrodes D, serving as input units of the plurality of transistors of the transistor layer 1, via the through hole groups 2, each serving as an interlayer connection conductor constituted by a plurality of through holes. As illustrated in FIG. 10, the metal interconnection layer 11 is connected to the plurality of source electrodes S, serving as output units of the plurality of transistors of the transistor layer 1, via the through hole groups 3, each serving as an interlayer connection conductor constituted by a plurality of through holes.

In this manner, in the present embodiment, the interconnection layer on the second layer, located in the upper layer, is split into more layers, the metal interconnection layers 20, 21, and 22, than those in the first embodiment. These interconnection layers connected to electrodes of different types are arranged alternately in the arranging direction (up-down direction in FIG. 8). Thus, in the metal interconnection layer 10 or 11 in the lower layer, since an interconnection length from the through hole group 2 or the through hole group 3 is short, voltage drop caused by interconnection resistance in the metal interconnection layers 10 and 11 in the first layer can be reduced. Also, in the metal interconnection layer 10 or 11 in the first layer, in the interconnection from each of the through hole groups 2 or each of the through hole groups 3, current of each of the transistors of the transistor layer 1 connected to each of the through hole groups 2 or each of the through hole groups 3 flows. Thus, in a case in which the interconnection length in the metal interconnection layers 10 and 11 is long, current of many transistors flows in this interconnection. The summed current flows via the through holes 4 and 5 into the metal interconnection layers 20, 21, and 22. Thus, the current densities in the metal interconnection layers 10 and 11 around the through holes 4 and 5 are high. However, since the interconnection length to each of the through holes 4 or each of the through holes 5 in the metal interconnection layer 10 or 11 is short, the current densities can be reduced.

As illustrated in FIG. 9, the current Id flowing from the metal interconnection layers 20 and 22 on the drain side to the transistor layer 1 passes through the through holes 4, the metal interconnection layer 10, and the through hole groups 2 down to the transistor layer 1. As for the potential of the upper surfaces of the through hole groups 2, the potential is lower as the through hole group 2 has a longer distance from the through hole 4A on the drain side and is closer to the center part of the metal interconnection layer 10 due to voltage drop caused by interconnection resistance of the metal interconnection layer 10. Thus, in the metal interconnection layer 21 on the source side, the distribution density of the through hole group 2 closer to a center line C perpendicular to the arranging direction (up-down direction in FIG. 8) of the metal interconnection layers 20, 21, and 22 is heightened further, and the distribution density of the through hole group 2 closer to the through hole 4A connected to the each of the metal interconnection layers 20 and 22 on the drain side located beside the metal interconnection layer 21 is lowered further, to adjust the resistance values.

As illustrated in FIG. 10, the current Is passing through the through hole groups 3 from the transistor layer 1 and flowing into the metal interconnection layer 11 passes through the through holes 5 and flows into the metal interconnection layer 21 on the drain side. In the metal interconnection layer 11 under the metal interconnection layer 21 on the drain side, the distribution density of the through hole group 3 closer to the through hole 5B connected to the metal interconnection layer 21 is lowered further, and the distribution density of the through hole group 3 more away from the through hole 5B is heightened further. As a result of such adjustment of the distribution densities of the through hole groups 3, the current densities of the transistor layer 1 can be uniform. It is to be noted that, in the above second embodiment, a case in which one metal interconnection layer 21 provided with the output terminal pad 8 is arranged between two metal interconnection layers 20 and 22 provided with the input terminal pad 7 has been described. However, conversely, in a case in which one metal interconnection layer provided with the input terminal pad is arranged between two metal interconnection layers provided with the output terminal pad, the current densities of the transistor layer 1 can be uniform by adjusting the distribution densities of the through hole groups in a similar method.

Third Embodiment

Next, a third embodiment will be described with reference to FIG. 11.

Figure 11:
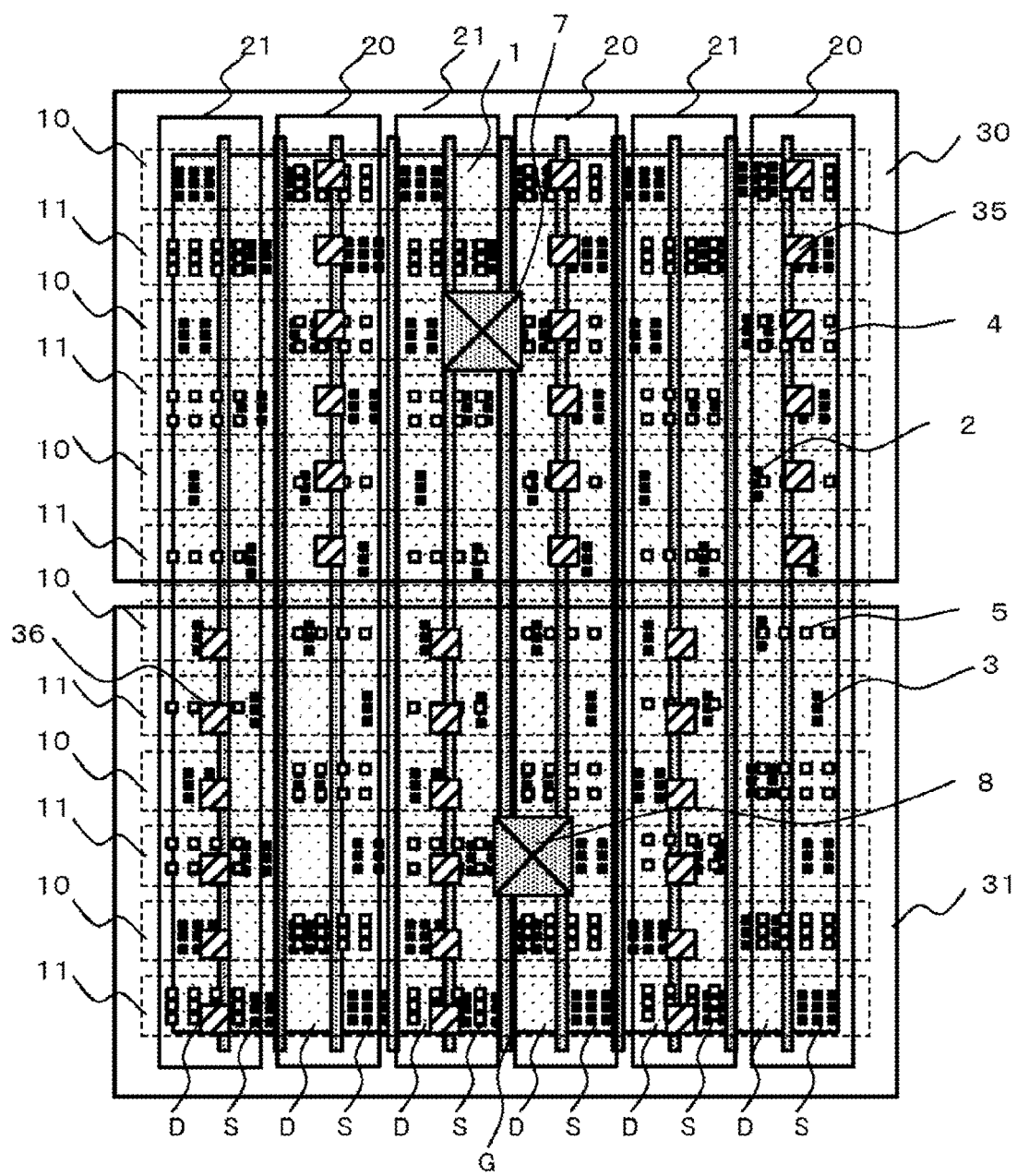
FIG. 11 is a plan view of a semiconductor device according to a third embodiment.

FIG. 11 is a plan view of a semiconductor device according to the third embodiment including metal interconnection layers in a three-layered structure. The metal interconnection layer on the drain side in a second layer and the metal interconnection layer 21 on the source side in the second layer extend in a direction in which a metal interconnection layer 30 on the drain side in a third layer and a metal interconnection layer 31 on the source side in the third layer are opposed to each other. The metal interconnection layers 10 and 11 in a first layer are arranged in parallel to intersect with the metal interconnection layers 20 and 21 in the second layer.

The plurality of drain electrodes D serving as input units of the transistor layer 1 are connected to the input terminal pad 7 via the through hole groups 2 serving as interlayer connection conductors constituted by a plurality of through holes, the metal interconnection layers 10, the through hole groups 4 serving as interlayer connection conductors constituted by a plurality of through holes, the metal interconnection layer 20, through holes 35, and the metal interconnection layer 30. The plurality of source electrodes S serving as output units of the transistor layer 1 are connected to the output terminal pad 8 via the through hole groups 3 serving as interlayer connection conductors constituted by a plurality of through holes, the metal interconnection layers 11, the through hole groups 5 serving as interlayer connection conductors constituted by a plurality of through holes, the metal interconnection layer 21, through holes 36, and the metal interconnection layer 31.

To make the current densities of the respective transistors in the transistor layer 1 uniform, the distribution densities of the through holes constituting the through hole groups 2 and 3 are lowered in the metal interconnection layers 10 and 11 located in a position in which the metal interconnection layers 30 and 31 are opposed, and the distribution densities of the through holes constituting the through hole groups 2 and 3 are heightened as the through hole groups 2 and 3 are more away from this position. Also, similarly, the distribution densities of the through holes constituting the through hole groups 4 and 5 are lowered in the metal interconnection layers 20 and 21 located in a position in which the metal interconnection layers 30 and 31 are opposed, and the distribution densities of the through holes constituting the through hole groups 4 and 5 are heightened as the through hole groups 4 and 5 are more away from this position. In the present embodiment, since adjustment of the resistance values is performed in the through hole groups 2 and 3 and the through hole groups 4 and 5, the adjustable range of the resistance values in the through hole groups can be broader than those in the first and second embodiments. Accordingly, even in a case in which voltage drop caused by resistance of the metal interconnection layers 10 and 11 and the metal interconnection layers 20 and 21 is great, the resistance values can be adjusted in the through hole groups.

In the aforementioned first to third embodiments, although a case in the metal interconnection layer is in a two-layered or three-layered structure has been described, the present invention can be achieved even in a case in which the metal interconnection layer is in a four- or more-layered structure. Also, the number and the shape of each through hole arranged in each metal interconnection layer are schematically illustrated to facilitate understanding of the embodiments and are not limited to those in the aforementioned embodiments.

In the aforementioned first to third embodiments, the MOS transistor is illustrated in the description. However, the transistor is not limited to the MOS transistor and may be a bipolar transistor. The plurality of transistors may be separated by insulators.

In the aforementioned first to third embodiments, an example in which one semiconductor device is implemented on the same semiconductor chip has been described. However, the present invention can be achieved by a semiconductor integrated circuit in which the two or more aforementioned semiconductor devices are implemented on the same semiconductor chip.

In the aforementioned first to third embodiments, the following effects are exerted.

(1) By making the current densities on the transistor layer uniform, a local increase of the current density can be restricted in the metal interconnection layers connected to the input units or the output units of the transistor layer, and degradation caused by electromigration can be restricted. In general, in a case in which the current densities of the transistor layer are not uniform, the metal interconnection layer connected to the transistor arranged at a region in the transistor layer with a high current density has a high current density. Thus, the duration of this metal interconnection layer is shortened due to the electromigration. On the other hand, in the present embodiments, by making the current densities of the transistor layer uniform, shortening of the duration of the metal interconnection layer due to the electromigration can be prevented, the duration can be extended, and reliability as a semiconductor device can be improved.

(2) In the semiconductor device, since shortening of the interconnection duration due to the electromigration can be restricted, and the chip area can be reduced, cost of the semiconductor device can be reduced. In general, to prevent shortening of the duration due to the electromigration, the current density of the metal interconnection layer is required to be equal to or less than an allowable value. However, to reduce cost of the transistors, reduction of the chip size is required, and reduction of the chip size brings about an increase of the current density. Thus, due to the limitation of the allowable current density, reduction of the chip size has a limitation. However, in the present embodiment, since the current densities on the transistor layer can be uniform, the maximum current density in the metal interconnection layer on the transistor layer can be equal to or less than the allowable current density, the average current density in the entire transistor layer can be raised, and the chip area can be reduced.

(3) By making the current densities of the transistor layer uniform, a resistance value of the metal interconnection layer and the transistor between the drain terminal and the source terminal can be decreased. The drain terminal is equivalent to the input terminal pad 7 in FIG. 1, and the source terminal is equivalent to the output terminal pad 8 in FIG. 1. In a case in which the current densities of the transistor layer are non-uniform, in a region of the metal interconnection layer having a high current value, voltage drop is great, and voltage applied to the transistor is lowered. Also, since the current densities are non-uniform, some of the transistors are not used effectively. By making the current densities of the transistor layer uniform, a resistance value between the drain terminal and the source terminal can be decreased.

(4) The current densities can be adjusted by heightening the distribution density of the through holes so that the resistance value of the through hole group may be low or lowering the distribution density of the through holes so that the resistance value of the through hole group may be high. Thus, all that should be done is to change the distribution density of the through holes, no change is required in a semiconductor manufacturing process, and the present invention can easily be applied to an existing semiconductor manufacturing process.

Fourth Embodiment

Figure 12:
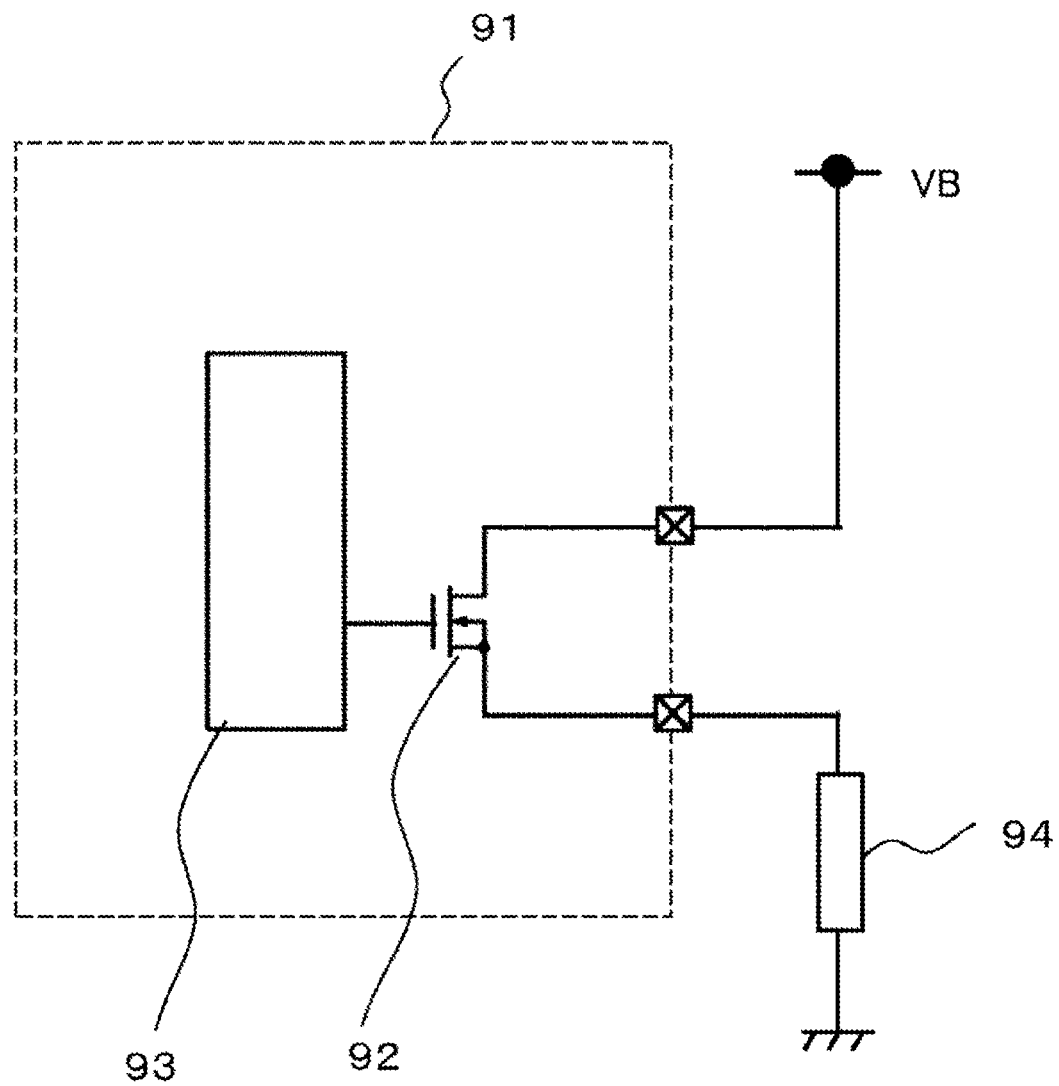
FIG. 12 illustrates a circuit configuration of a load driving device.

Next, an example in which the semiconductor device illustrated in the first to third embodiments has been applied to a load driving device will be described. FIG. 12 illustrates a circuit configuration of a load driving device 91. In FIG. 12, the semiconductor device illustrated in the first to third embodiments is equivalent to a switching element 92.

As illustrated in FIG. 12, a power supply VB is connected to an input terminal of the switching element 92. Also, a load 94 is connected to an output terminal of the switching element 92. Further, a gate driving circuit 93 is connected to a control terminal of the switching element 92.

By applying voltage for gate control to the control terminal of the switching element 92 by means of the gate driving circuit 93, output current of the switching element 92 is subject to ON/OFF control to control current flowing into the load 94.

In a case of driving a load such as an in-vehicle electromagnetic actuator by means of the switching element 92, the switching element 92 performs current control of approximately 1 A under a high temperature environment in which a semiconductor junction temperature is 175° C. In general, in the switching element 92 used at a high temperature and high current, a reliability failure caused by the electromigration of the metal interconnection layer is of concern. However, by using the semiconductor device illustrated in the first to third embodiments as the switching element 92, the failure caused by the electromigration can be prevented, and the current density of the metal interconnection layer can be restricted to allowable current or less.

Also, when the area of the transistors is reduced, the average current density is heightened. However, by using the semiconductor device illustrated in the first to third embodiments as the switching element 92, it is possible to restrict the metal interconnection layer from locally having a high current density, and the area of the semiconductor device can be reduced as much.

A transistor in which high current flows such as the switching element 92, which drives a load such as an in-vehicle electromagnetic actuator, is required to be as large as several hundred or higher micrometers, and occupies a large area in the semiconductor device. However, by using the semiconductor device illustrated in the first to third embodiments as the switching element, the area of the semiconductor device can be reduced, and the chip cost of the semiconductor device can be reduced.

According to the aforementioned embodiments, the following effects can be exerted.

(1) The semiconductor device includes the transistor layer 1 having arranged thereon in a two-dimensional manner the plurality of transistors each including the drain electrode D, the source electrode S, and the gate electrode G, the plurality of interconnection layers configured to electrically connect the drain electrodes D of the plurality of transistors of the transistor layer 1 to the input terminal and electrically connect the source electrodes S to the output terminal, and the plurality of interlayer connection conductors respectively connecting the plurality of interconnection layers to the transistor layer 1. The plurality of interconnection layers include as the interconnection layer in the second layer the interconnection layer having arranged therein along the predetermined arranging direction the metal interconnection layer 20 serving as an input side interconnection layer connected to the input terminal via the input terminal pad 7 and the metal interconnection layer 21 serving as an output side interconnection layer connected to the output terminal via the output terminal pad 8. The resistance values of the plurality of interlayer connection conductors differ from each other depending on the position in the arranging direction of the metal interconnection layers 20 and 21. Specifically, the plurality of interconnection layers include the interconnection layer in the second layer including the metal interconnection layers 20 and 21 and the interconnection layer in the first layer provided further on a side of the transistor layer 1 than the interconnection layer in the second layer and including the plurality of metal interconnection layers 10 and 11. The plurality of interlayer connection conductors include the plurality of through hole groups 2 and 3 connecting the metal interconnection layers 10 and 11 to the drain electrodes D and the source electrodes S of the plurality of transistors of the transistor layer 1. The resistance values of the plurality of through hole groups 2 and 3 differ from each other depending on the position in the arranging direction of the metal interconnection layers 20 and 21. Accordingly, the current densities of the transistors arranged to be distributed in the two-dimensional manner can be uniform.

(2) The resistance values of the plurality of through hole groups 2 and 3 change at least based on the interconnection lengths in the metal interconnection layers 10 and 11. Accordingly, interconnection resistance based on the interconnection length can be adjusted by the resistance value of each of the through hole groups 2 and 3.

(3) The plurality of interlayer connection conductors include the plurality of through hole groups 2 and 3 and the through holes 4 and 5 connecting the metal interconnection layers 20 and 21 to the metal interconnection layers 10 and 11. The interconnection length of each of the metal interconnection layers 10 and 11 has a start point at a position of each of the through holes 4 and 5. Accordingly, adjustment of the resistance value of each of the through hole groups 2 and 3 can be performed with reference to the position of each of the through holes 4 and 5.

(4) The resistance value of each of the through hole groups 2 and 3 is higher as each of the through hole groups 2 and 3 is closer to a boundary between the metal interconnection layer 20 serving as an input side interconnection layer and the metal interconnection layer 21 serving as an output side interconnection layer. Accordingly, the potential differences of the upper surfaces of the through hole groups 2 and 3 can be uniform regardless of the position on the transistor layer.

(5) In the second embodiment, in the interconnection layer in the first layer, two metal interconnection layers 20 and 22 serving as input side interconnection layers and one metal interconnection layer 21 serving as an output side interconnection layer are alternately arranged along the arranging direction, which is the up-down direction in FIG. 8. The resistance value of each of the through hole groups 2 and 3 is lower as each of the through hole groups 2 and 3 is closer to the center line C perpendicular to the arranging direction in one metal interconnection layer 21 arranged between two metal interconnection layers 20 and 22. Accordingly, even in a case in which the metal interconnection layer in the first layer is split into three, the potential differences of the upper surfaces of the through hole groups 2 and 3 can be uniform.

(6) Each of the plurality of through hole groups 2 and 3 is constituted by the plurality of through holes, and the resistance value of each of the plurality of through hole groups 2 and 3 changes depending on the distribution density of the through holes constituting each of the through hole groups 2 and 3. Accordingly, the resistance values of the through hole groups can be adjusted.

(7) The interconnection resistance of the metal interconnection layers 20 and 21 is lower than the interconnection resistance of the metal interconnection layers 10 and 11. Accordingly, the resistance values of the through holes can be adjusted only in consideration of the interconnection resistance of the metal interconnection layers 10 and 11.

(8) The semiconductor integrated circuit in which at least one semiconductor device is implemented on the same semiconductor chip is provided. Accordingly, the semiconductor integrated circuit in which two or more semiconductor devices are implemented on the same semiconductor chip is obtained.

(9) The load driving device using the semiconductor device as a switching element and applying voltage to a gate of the switching element to drive a load connected to the switching element is provided. By using the semiconductor device as the switching element, the area of the semiconductor device can be reduced, and the chip cost of the semiconductor device can be reduced.

The present invention is not limited to the above embodiments, and other conceivable embodiments within the scope of the technical idea of the present invention are included in the scope of the present invention as long as they have characteristics of the present invention. Also, the above embodiments and a plurality of modification examples may be combined.

REFERENCE SIGNS LIST

1 transistor layer
2, 3 through hole group
7 input terminal pad
8 output terminal pad
10, 11 metal interconnection layer in first layer
20, 21 metal interconnection layer in second layer
30, 31 metal interconnection layer in third layer
Id, Is current
D drain electrode
S source electrode
G gate electrode
91 load driving device
92 switching element
93 gate driving circuit
94 load

The invention claimed is:

1. A semiconductor device comprising:
a transistor layer having arranged thereon in a two-dimensional manner a plurality of transistors each including an input unit, an output unit, and a control unit;
a plurality of interconnection layers configured to electrically connect the input units of the plurality of transistors to an input terminal and electrically connect the output units of the plurality of transistors to an output terminal; and
a plurality of interlayer connection conductors respectively connecting the plurality of interconnection layers to the transistor layer,
wherein the plurality of interconnection layers include a first interconnection layer having arranged therein along a predetermined arranging direction at least one input side interconnection layer connected to the input terminal and at least one output side interconnection layer connected to the output terminal, and
wherein resistance values of the plurality of interlayer connection conductors differ from each other depending on a position in the arranging direction.

2. The semiconductor device according to claim 1, wherein the plurality of interconnection layers include the first interconnection layer and a second interconnection layer provided further on a side of the transistor layer than the first interconnection layer,
wherein the plurality of interlayer connection conductors include a plurality of first interlayer connection conductors connecting the second interconnection layer to the input units and the output units of the plurality of transistors, and
wherein resistance values of the plurality of first interlayer connection conductors differ from each other depending on a position in the arranging direction.

3. The semiconductor device according to claim 2, wherein the resistance values of the plurality of first interlayer connection conductors change at least based on an interconnection length of the second interconnection layer.

4. The semiconductor device according to claim 3, wherein the plurality of interlayer connection conductors include the plurality of first interlayer connection conductors and a second interlayer connection conductor connecting the first interconnection layer to the second interconnection layer, and
wherein an interconnection length of the second interconnection layer has a start point at a position of the second interlayer connection conductor.

5. The semiconductor device according to claim 2, wherein a resistance value of the first interlayer connection conductor is higher as the first interlayer connection conductor is closer to a boundary between the input side interconnection layer and the output side interconnection layer.

6. The semiconductor device according to claim 2, wherein, in the first interconnection layer, the two input side interconnection layers and the one output side interconnection layer, or the one input side interconnection layer and the two output side interconnection layers, are alternately arranged along the arranging direction, and wherein a resistance value of the first interlayer connection conductor is lower as the first interlayer connection conductor is closer to a center line perpendicular to the arranging direction in the one output side interconnection layer arranged between the two input side interconnection layers or a center line perpendicular to the arranging direction in the one input side interconnection layer arranged between the two output side interconnection layers.

7. The semiconductor device according to claim 2, wherein each of the plurality of first interlayer connection conductors is constituted by a plurality of connection conductors, and wherein a resistance value of each of the plurality of first interlayer connection conductors changes depending on a distribution density of the connection conductors constituting each of the first interlayer connection conductors.

8. The semiconductor device according to claim 2, wherein interconnection resistance of the first interconnection layer is lower than interconnection resistance of the second interconnection layer.

9. A semiconductor integrated circuit in which the at least one semiconductor device according to claim 1 is implemented on a same semiconductor chip.

10. A load driving device using the semiconductor device according to claim 1 as a switching element and applying voltage to a control unit of the switching element to drive a load connected to the switching element.

* * * * *